May 18, 1965 A. E. ROSENBERG 3,184,069

PRINTED CIRCUIT CARD RACK

Filed March 29, 1962 3 Sheets-Sheet 1

INVENTOR.
ALLEN E. ROSENBERG
BY
Max Schwartz
ATTORNEY

INVENTOR.
ALLEN E. ROSENBERG
BY
Max Schwartz
ATTORNEY

May 18, 1965 A. E. ROSENBERG 3,184,069

PRINTED CIRCUIT CARD RACK

Filed March 29, 1962 3 Sheets-Sheet 3

INVENTOR
ALLEN E. ROSENBERG

BY Max Schwartz
ATTORNEY 3,184,069
Patented May 18, 1965

3,184,069

PRINTED CIRCUIT CARD RACK

Allen E. Rosenberg, Brookline, Mass., assignor to Garde Manufacturing Company, Cumberland, R.I., a corporation of Rhode Island
Filed Mar. 29, 1962, Ser. No. 183,495
8 Claims. (Cl. 211—41)

My present invention relates to electronic devices and more particularly to a rack for holding printed circuit cards.

The principal object of the present invention is to provide a rack for holding a multiplicity of printed circuit cards in connected position.

Another object of the present invention is to provide a rack for holding printed cricuit cards which is readily adapted for variable spacings to compensate for different thicknesses of printed circuit cards.

A further object of the present invention is to provide a printed circuit card rack which is readily adjustable for different widths and different lengths of printed circuit cards.

A further object of the present invention is to provide a printed circuit card rack in which the guide rails can be quickly and easily displaced and moved without the loss of accuracy.

Another object of the present invention is to provide a printed circuit card rack in which the cards will slide easily into the rack regardless of the movement or position of the card slides.

Another object of the present invention is to provide a printed circuit card rack which is simple in construction and easy and economical to manufacture and assemble.

With the above and other objects and advantageous features in view my invention consists of a novel arrangement of parts more fully disclosed in the detailed description following in conjunction with the accompanying drawings and more particularly defined in the appended claims.

In the assembly of many electronic components, it is customary to provide a frame or rack into which a plurality of printed circuit cards or boards can be slid side by side in parallel relation. It is essential that the rack be compact but be able to hold a maximum number of boards. Since each printed circuit is different from the next one and is provided with a plurality of components such as condensers, diodes, etc. the space required for thickness of each board varies. It is therefore necessary that the rack be constructed so that it will compensate for this variation. The racks for the printed circuit boards in use today are normally provided with fixed guide rails or slides placed a certain distance apart. Where the printed circuit board will not fit in the space of the prior art devices between any adjacent guide slides, the next slide is left blank to provide the necessary space. This results in a great deal of wasted space. The rack of the present invention is designed to permit minute adjustments for different board thicknesses which can be made rapidly by easily moving the card slides just enough to clear the particular printed circuit card. Thus the rack will be able to hold a great many more cards than has heretofore been possible with the standard constructions now in use.

Figure 1:
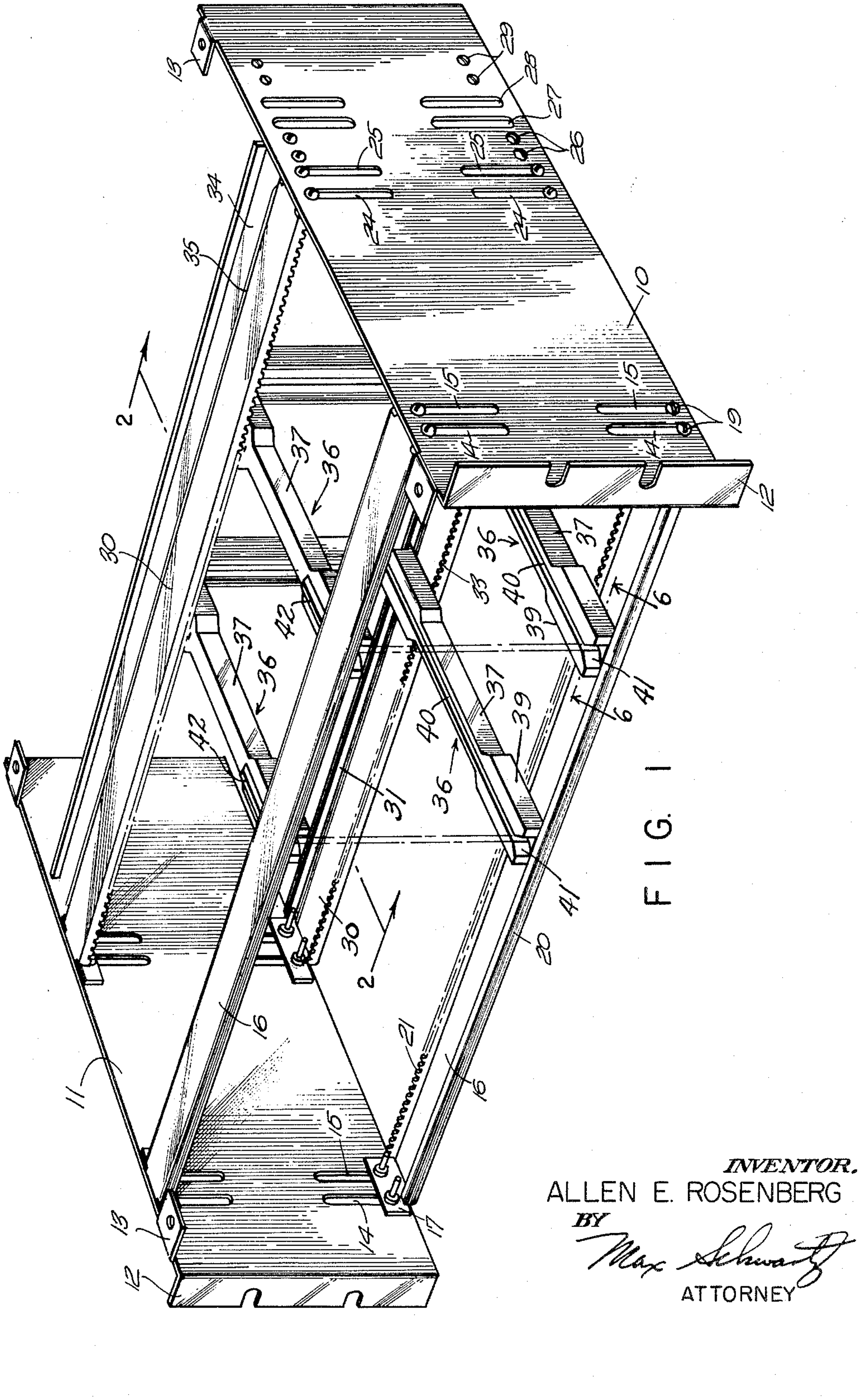
FIG. 1 is a perspective view of a printed circuit card rack embodying my invention.
Figures 2, 3, 4, 5, 6:
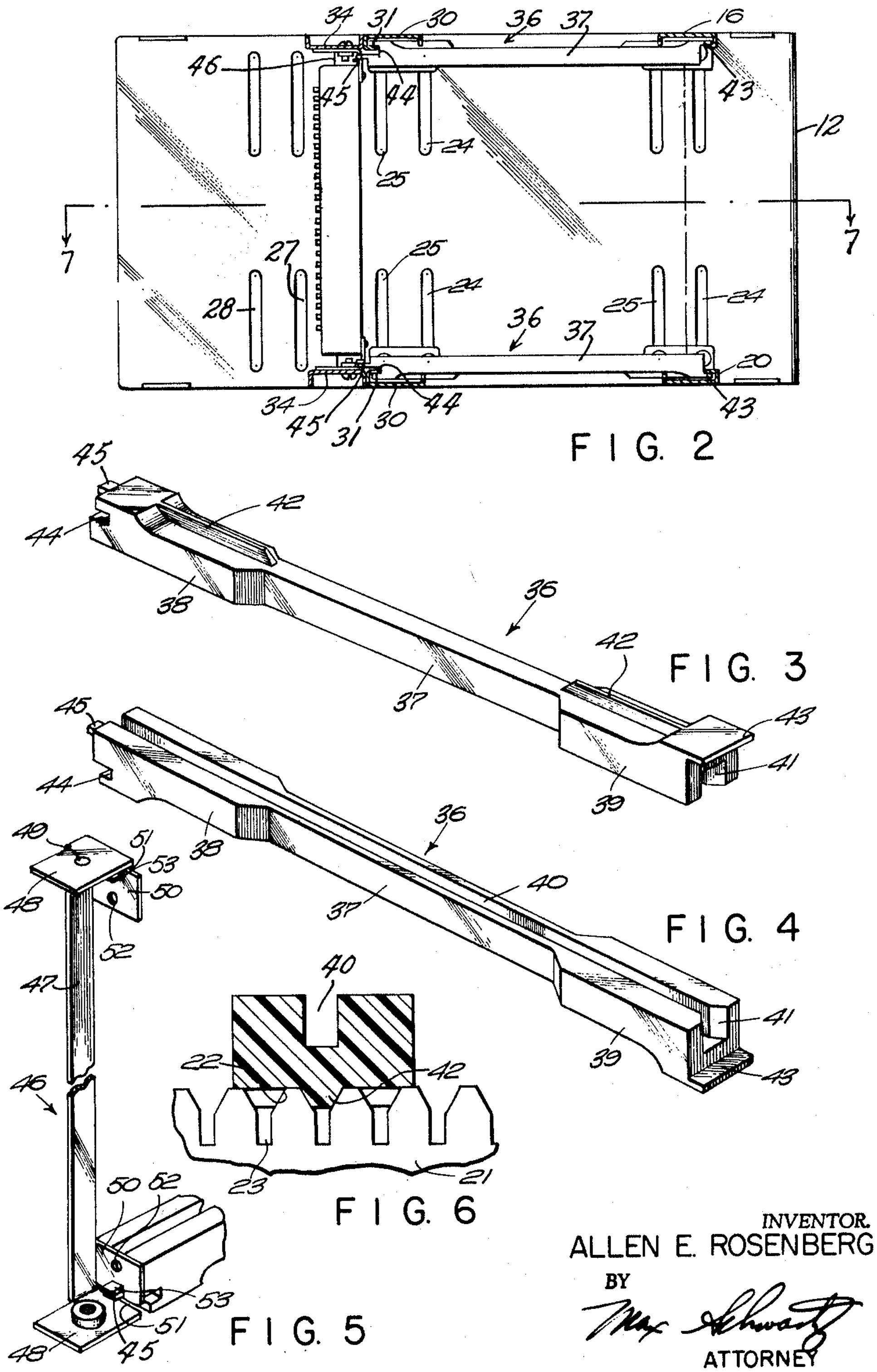
FIG. 2 is a section taken on line 2—2 on FIG. 1.
FIG. 3 shows an outside face of a slide and its rib.
FIG. 4 shows an inside face of a slide with its card slot up.
FIG. 5 is a perspective view of one of the brackets for holding the multiple connector.
FIG. 6 is an enlarged section taken through line 6—6 on FIG. 1.
Figure 7:
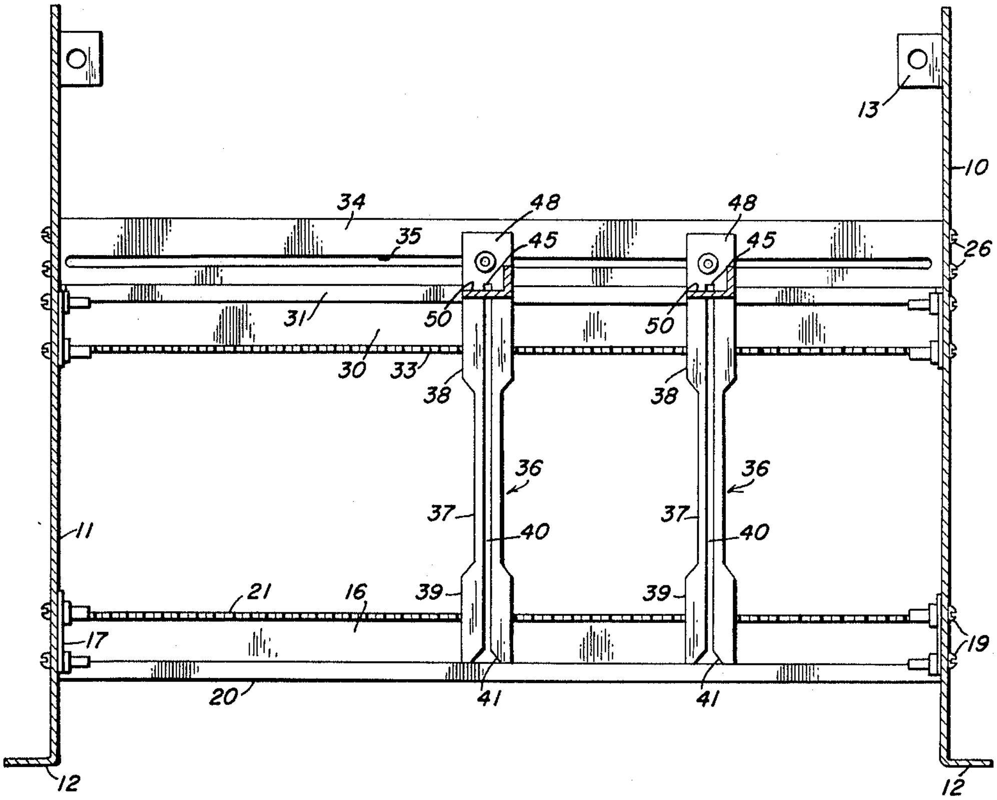
FIG. 7 is a section taken on line 7—7 on FIG. 2.

Referring more in detail to the drawings illustrating my invention, FIG. 1 shows the rack in the position in which it is normally mounted so that it will receive the printed circuit cards on edge in a vertical plane. The device comprises a pair of end plates 10 and 11 of elongated rectangular construction having their front edges 12 turned outwardly as flanges at right angles for assembly purposes. The plates 10 and 11 are provided with spaced ears 13 extending inwardly at right angles from the rear edge and from adjacent the front edge also for assembly purposes. Each plate 10 and 11 is provided adjacent its front edge with spaced pairs of elongated slots 14 and 15. The pair of slots 14 are vertically aligned and extend inwardly from adjacent the top and bottom edges of the plates 10 and 11. The slots 15 are in spaced parallel relation to the slots 14 except that they are further inwardly along the plate. In actual practice the slots 14 and 15 are approximately one inch apart. I now provide a pair of guide rails 16 extending in spaced parallel relation from opposite edges of the plates 10 and 11 as shown in FIG. 1. The guide rails 16 are provided at their ends with upturned tab portions 17 having spaced openings. Screws 19 extend through the slots 14 and 15 into the spaced openings of the tabs 17 to lock the guide rails in position. It is evident that by loosening the screws 19 the guide rails can be moved along the slots 14 and 15 toward and away from each other to narrow and widen the space between the guide rails. This adjustment is for purposes of adjusting the guide rails to fit the width of the particular printed circuit cards being mounted in the rack. The front edge of each guide rail 16 is reentrantly bent to form an inwardly facing channel portion 20, see FIGS. 1 and 2. The rear edge of each guide rail 16 is bent inwardly at right angles at 21, the portion 21 being formed into a serrated edge as shown in FIG. 6. Each serration includes a tooth like member 22 separated from the adjacent member by a notch 23. When the triangle projection on the card slide enters one of these notches, the notch 23 permits it to fit snugly without rocking.

Spaced from the inner end of each plate 10 and 11 are two sets of openings designed to permit adjustment for the length of the printed circuit card. The first set of openings comprise a pair of spaced aligned slots 24 and 25 similar to the slots 14 and 15. Adjacent the slots 24 and 25 are a pair of openings 26 without slots and designed merely to receive the screws. Adjacent these are a second pair of slots 27 and 28 similar to the slots 24 and 25 and adjacent these are the screw openings 29.

I now provide a second pair of guide rails 30 identical to the guide rails 16 and mounted at each end either in the slots 24 and 25 or in the slots 27 and 28 depending on the necessary adjustment for the length of the printed circuit card. If the card is longer then the guide rails 30 must be mounted in the openings 27 and 28. For shorter cards they should be mounted in the openings 24 and 25. The guide rails 30 are identical to the guide rails 16 and are also provided with a reentrantly bent edge 31 and an edge 32 bent at right angles and provided with teeth 33. However, the guide rail 30 is turned so that the edge with the teeth 33 is inwardly placed in both senses and the reentrantly bent edge 31 is at the rear, see FIGS. 1 and 2. I now provide a pair of rail supporting members 34 of general channel cross section and having end tabs mounted in the openings 26 or 29. These rails 34 do not require adjustment for cards of different width, therefore they are not mounted in slots but in openings, but they do require transverse adjustments for the length of the card. Therefore there are a set of openings 26 to go with the openings 24 and 25 and a set of openings 29 to go with the openings 27 and 28. The channel shaped members 34 are provided with elongated slots 35 extending virtually the full length of each member 34.

Now referring to FIGS. 1, 3 and 4, I provide a plurality of pairs of card slides mounted in opposed relation along the guide rails and engaging the guide rail teeth 21 and 33 as shown in FIG. 1. Each card slide 36 is preferably molded of a resilient plastic material and comprises a generally elongated member having a varying rectangular cross section. The elongated member has a varying comparatively thin or narrow central portion 37 and a varying wider portion 38 and 39 at each end. The narrow portion 37 tapers towards the wider portion 38 and 39 as shown in FIGS. 3 and 4. Each slide member 36 is provided with a slot 40 extending from end to end and adapted to receive the printed circuit card in facing slots. The forward or front end of each member 36 is the portion 39 and at this point each slot 40 is provided with a flared end 41 for easy insertion of the card. The back or outer face of each card slide member 36 is provided at the wide portions 38 and 39 with a triangular rib 42. The forward end 39 is provided with an integral forwardly extending ledge 43 extending from the side opposite the slot 40. The opposite or rear end of each member 36, which comprises the wider portion 38 is provided with a transverse slot 44 extending below the level of the slot 40. The bottom wall of the slot 40 at this point is provided with a rearwardly extending tab 45.

Referring to FIGS. 1 and 2, when it is desired to prepare the frame or rack for the insertion of a particular type of cards, the various guide rails hereinabove described are positioned in their respective slots and openings to compensate for the particular size of printed circuit card to be used. A plurality of pairs of card holding slides 36 are now inserted in the rack. These card holding slides are now inserted as shown in FIGS. 1 and 2. Each member 36 is firmly grasped in the thin part 37 and the extended portion 43 at the front end is slipped forwardly into the U-shaped bend 20 of the channel guide member 16. The center part 37 is then flexed slightly to shorten the overall length so that the other or rear end can be inserted as shown in FIG. 2 with the U-shaped portion 31 extending into the slot 44. In this position the triangular sections 42 are locked in place as shown in FIG. 6. Each triangular section 42 is nesting between the teeth 22 or 33 and the flat portions are resting on the top of the teeth on each side to prevent rocking. Each printed circuit card is provided with various elements such as condensers and diodes which are mounted on the surface thereof. Therefore, the various printed circuit cards all require a different spacing. After it has been determined what the spacing is, the rack is filled with members 36 spaced sufficiently apart to accommodate the printed circuit cards. The small teeth 22 and 33 permit fine adjustment to allow a maximum number of pairs of guides 36 to be inserted in the rack.

The rear end of each card must enter a multiple connector. I therefore provide a mounting 46 illustrated in FIG. 5 for holding a multiple electrical terminal connector. It is only necessary to adjust the holder for the connector for different widths. Therefore each holder 46 is provided with a elongated vertical strip 47 having tabs 48 at each end. Each tab 48 is provided with a central opening 49 to which a screw can be mounted for locking the holder 46 in the elongated slots 35 in the channel members 34. The multiple circuit connector is mounted on integral tabs 50 which extend from one edge of the member 47 adjacent each tab 48 but spaced from the tab at right angles thereto to form slots 51 as shown in FIG. 5. Each tab 50 is provided with a central opening 52 for mounting the multiple connector thereon. Where the printed circuit card is narrow and the multiple circuit connector is short, the tabs 50 are elongated down parallel to 47 to provide the necessary support. Each tab 50 is provided at the inner edge adjacent the slot 51 with a bent out portion 53 forming a rectangular opening. The inner end of each member 36 is provided with a tab 45 hereinabove described. This tab 45 extends into the opening formed by the tab 53 to properly position the printed circuit card with relation to the multiple circuit connector. In other wards when the members 46 are so mounted, see FIG. 2, that they are directly over the ends of the members 36, then when the printed circuit card is slipped into the slots 40 the electrical terminals will enter in their inserted position the multiple circuit connectors mounted in the holders 46.

Thus the holders for the printed circuit connectors are adjustable all along the elongated slots 35 in the channel guide members 34. The rack of the present invention is therefore designed to hold a maximum number of printed circuit cards in any given space. This is so because the spacing between the grooves or slots 40 which hold the printed circuit cards is not fixed and can be adjusted by flexing the guide members 36 and moving them one or more notches in either direction. Thus a maximum number of printed circuit cards can be inserted in the rack. The multiple connectors can also be adjusted without limit and will be properly aligned with the slots when the tabs 45 in the guide members 36 enter the portions 53 in each holder 46.

I have thus provided a rack which is simple in construction and easy and economical to manufacture and assemble. The various guide elements are rapidly adjustable and the rack is designed to hold a maximum number of readily inserted cards. Other advantages of the present invention will be readily apparent to a person skilled in the art.

I claim:

1. A rack for holding a plurality of printed circuit cards comprising a frame having a rectangular plate at each end, a pair of spaced parallel channel members extending between said plates adjacent one side, a second pair of spaced parallel channel members extending between said plates adjacent the other side, a plurality of vertically disposed pairs of card slides mounted between said channel members, each vertically disposed pair of slides having mutually opposed slots for holding the printed circuit cards, means for adjusting the channel members to adjust for the length of the printed circuit cards, and means for mounting a multiple connector at the rear ends of each said pair of card slides, said channel members having a row of teeth along one edge at right angles to the channel member, the external face of each of said card slides having a rib outwardly thereof with said ribs held transversely extending between said teeth.

2. A rack for holding a plurality of printed circuit cards comprising a frame having a rectangular plate at each end, a pair of spaced parallel channel members extending between said plates adjacent one side, a second pair of spaced parallel channel members extending between said plates adjacent the other side, a plurality of vertically disposed pairs of card slides mounted between said channel members, each vertically disposed pair of slides having mutually opposed slots for holding the printed circuit cards, means for adjusting the channel members to adjust for the width of the printed circuit cards, means for adjusting the channel members to adjust for the length of the printed circuit cards, and means for mounting a multiple connector at the rear ends of each said pair of card slides, said channel members having a row of teeth along one edge at right angles to the channel member, the external face of each of said card slides having a rib outwardly thereof with said ribs held transversely extending between said teeth.

3. A rack for holding a plurality of printed circuit cards comprising a frame having a rectangular plate at each end, a pair of spaced parallel channel members extending between said plates adjacent one side, a second pair of spaced parallel channel members extending between said plates adjacent the other side, a plurality of vertically disposed pairs of card slides mounted between said channel members, each vertically disposed pair of slides having mutually opposed slots for holding the printed circuit cards, means for adjusting the channel members to adjust for the length of the printed circuit cards, said slides being selectively positioned longitudinally of said rack along said channel members, and means for mounting a multiple connector at the rear ends of each said pair of card slides, said channel members having a row of teeth along one edge at right angles to the channel member, the external face of each of said card slides having a rib outwardly thereof with said ribs held transversely extending between said teeth.

4. A rack for holding a plurality of printed circuit cards comprising a frame having a rectangular plate at each end, a pair of spaced parallel channel members extending between said plates adjacent one side, a second pair of spaced parallel channel members extending between said plates adjacent the other side, a plurality of vertically disposed pairs of card slides mounted between said channel members, each vertically disposed pair of slides having mutually opposed slots for holding the printed circuit cards, means for adjusting the channel members to adjust for the width of the printed circuit cards, means for adjusting the channel members to adjust for the length of the printed circuit cards, said slides being selectively positioned longitudinally of said rack along said channel members, and means for mounting a multiple connector at the rear ends of each said pair of card slides, said channel members having a row of teeth along one edge at right angles to the channel member, the external face of each of said card slides having a rib outwardly thereof with said ribs held transversely extending between said teeth.

5. A rack for holding a plurality of printed circuit cards comprising a frame having a rectangular plate at each end, a pair of spaced parallel channel members extending between said plates adjacent one side, a second pair of spaced parallel channel members extending between said plates adjacent the other side, a plurality of vertically disposed pairs of card slides mounted between said channel members, each vertically disposed pair of slides having mutually opposed slots for holding the printed circuit cards, and means for mounting a multiple connector at the rear ends of each said pair of card slides, said card slides having tabs and said connector mounting means having openings for receiving said tabs for centering said connectors.

6. A rack for holding a plurality of printed circuit cards comprising a frame having a rectangular plate at each end, a pair of spaced parallel channel members extending between said plates adjacent one side, a second pair of spaced parallel channel members extending between said plates adjacent the other side, a plurality of vertically disposed pairs of card slides mounted between said channel members, each vertically disposed pair of slides having mutually opposed slots for holding the printed circuit cards, means for adjusting the channel members to adjust for the width of the printed circuit cards, and means for mounting a multiple connector at the rear ends of each said pair of card slides, said card slides having tabs and said connector mounting means having openings for receiving said tabs for centering said connectors.

7. A rack for holding a plurality of printed circuit cards comprising a frame having a rectangular plate at each end, a pair of spaced parallel channel members extending between said plates adjacent one side, a second pair of spaced parallel channel members extending between said plates adjacent the other side, a plurality of vertically disposed pairs of card slides mounted between said channel members, each vertically disposed pair of slides having mutually opposed slots for holding the printed circuit cards, means for adjusting the channel members to adjust for the length of the printed circuit cards, and means for mounting a multiple connector at the rear ends of each said pair of card slides, said card slides having tabs and said connector mounting means having openings for receiving said tabs for centering said connectors.

8. A rack for holding a plurality of printed circuit cards comprising a frame having a rectangular plate at each end, a pair of spaced parallel channel members extending between said plates adjacent one side, a second pair of spaced parallel channel members extending between said plates adjacent the other side, a plurality of vertically disposed pairs of card slides mounted between said channel members, each vertically dispoesd pair of slides having mutually opposed slots for holding the printed circuit cards, said slides being selectively positioned longitudinally of said rack along said channel members, and means for mounting a multiple connector at the rear ends of each said pair of card slides, said card slides having tabs and said connector mounting means having openings for receiving said tabs for centering said connectors.

References Cited by the Examiner

UNITED STATES PATENTS

| | | | |
|---|---|---|---|
| 338,440 | 3/86 | Raymond | 211—41 |
| 570,338 | 10/96 | Reed | 211—41 |
| 633,416 | 9/99 | Beaulieu | 211—41 |
| 970,401 | 9/10 | Grandperrin | 211—41 |
| 2,986,281 | 5/61 | Jordan | 211—41 |
| 3,014,594 | 12/61 | Kerstner | 211—41 |
| 3,016,148 | 1/62 | Riddle | 211—41 |
| 3,017,232 | 1/62 | Schwab | 211—41 X |

FRANK L. ABBOTT, *Primary Examiner.*

CLAUDE A. LE ROY, *Examiner.*